(12) United States Patent
Wang

(10) Patent No.: US 10,468,404 B2
(45) Date of Patent: Nov. 5, 2019

(54) MONOLITHICALLY INTEGRATED LOW LOSS PASSIVE COMPONENTS AND ASSOCIATED CIRCUITRY AND METHODS FOR THE MANUFACTURE THEREOF

(71) Applicant: BAE Systems Information and Electronic Systems Integration Inc., Nashua, NH (US)

(72) Inventor: Renyuan Wang, Nashua, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 15/908,938

(22) Filed: Mar. 1, 2018

(65) Prior Publication Data

US 2019/0273078 A1 Sep. 5, 2019

(51) Int. Cl.
*H01L 27/06* (2006.01)
*H03B 28/00* (2006.01)
*H01L 21/02* (2006.01)
*H01L 21/308* (2006.01)
*H01L 29/66* (2006.01)

(52) U.S. Cl.
CPC ...... *H01L 27/0629* (2013.01); *H01L 21/0254* (2013.01); *H01L 21/02378* (2013.01); *H01L 21/308* (2013.01); *H01L 29/66431* (2013.01); *H03B 28/00* (2013.01)

(58) Field of Classification Search
CPC .................................................... H01L 27/0629
USPC .................................................... 331/107 DP
See application file for complete search history.

(56) References Cited

U.S. PATENT DOCUMENTS

| | | | | |
|---|---|---|---|---|
| 5,617,065 A | * | 4/1997 | Dydyk | ...... H03H 3/04 310/321 |
| 2003/0015729 A1 | * | 1/2003 | Bosco | ...... H01L 21/02197 257/190 |

* cited by examiner

*Primary Examiner* — Joseph Chang
(74) *Attorney, Agent, or Firm* — Maine Cernota & Rardin; Scott J. Asmus

(57) ABSTRACT

An oscillator having a dielectric wave guiding resonant cavity and an oscillator circuit operatively coupled to the dielectric wave guiding resonant cavity having at least one transistor, the two being of a unitary construction.

18 Claims, 13 Drawing Sheets

MONOLITHICALLY INTEGRATED LOW LOSS PASSIVE COMPONENTS AND ASSOCIATED CIRCUITRY AND METHODS FOR THE MANUFACTURE THEREOF

FIELD OF THE DISCLOSURE

The disclosure relates to electronic components and methods of production, and more particularly, to the monolithic integration of low loss passive components with associated circuitry to produce high frequency, low size, weight, and power oscillators.

BACKGROUND OF THE DISCLOSURE

Wireless communication systems provide for dynamic exchange of data, controls and information. Such wireless communications however are subject to interference in many forms. The sum of the interferers in the information environment is sometimes referred to as the electromagnetic environment (EME). For example, military operations are generally executed in an information environment that is increasingly complicated by the EME that can include passive and active interference including jamming and electronic countermeasures.

Oscillators, which comprise passive components (e.g. a resonant cavity) and associated circuitry, are building blocks of many of the systems that operate in radio-frequency (RF) and microwave systems (e.g. radar transmitters and receivers, wireless communications systems, Analog-to-Digital Converters (ADCs), etc.). The performance of these systems is often dependent on the performance of oscillators used therein.

For instance, the performance of many microwave systems is limited by the master oscillator phase noise, which is also known as "jitter" when represented in the time domain. For example, in RF communications equipment, information is typically modulated on a carrier frequency, which results in side-bands, as illustrated in FIG. 1. Since the carrier frequency spectral width is finite, this limits channel capacity. By reducing phase noise, spectral content can be narrowed, resulting in higher channel capacity. Additionally, phase noise (manifesting as time jitter) in analog to digital conversion equipment results in uncertainties in both sampling time and the sampled signal value, as illustrated in FIG. 2A.

As a further example, in radar applications, the reflected signal from a moving target is often a frequency modulated and normally severely attenuated version of the transmitted radar signal, due to the Doppler effect, atmospheric attenuation, and low target radar cross-section. Therefore, the detection probability of low radar cross-section targets is fundamentally limited by the reference oscillator phase noise. In military skirmishes, where targets may move at speeds higher than 300 mph, the reflected signal is normally at an offset larger than 10 kHz away from the transmitted signal. This normally translates to a phase noise requirement of <140 dBc@10 kH offset at x-band for high fidelity target detection. However, as threats have evolved over the past few decades, radar has been widely applied for surveillance purposes, and it has become increasingly important for radar to detect slower-moving targets with lower radar cross-section, such as vehicles, and individuals. When dealing with such targets, the reflected signal is generally only hundreds of hertz away from the transmitted signal, as shown in FIG. 2B. This imposes much more stringent phase noise requirements on reference oscillators.

Unfortunately, oscillators that are able to provide state of the art phase noise at microwave/mm-wave frequencies that would tend to mitigate such issues also tend to be relatively large in size and weight and require a substantial amount of power to function (e.g. cryogenically cooled bench-top instruments). As a practical matter, the size, weight, power consumption, and, in some cases, ancillary requirements (e.g. cryogenic cooling systems) of such devices tends to preclude their use in defense and other applications having similar packaging and power limitations (e.g. on aircraft). In comparison to such state of the art oscillators, low Size Weight and Power (SWaP) oscillators, such as that shown in FIG. 3, rely on ovenized quartz oscillators and frequency conversion techniques to generate the required microwave frequency output. They offer phase noise performance that is on the order of 100× worse than state of the art benchtop solutions. This severely limits the performance of the RF and microwave systems of which such devices are a component, ultimately limiting their effectiveness.

What is needed, therefore, are improved methods of integrating low loss passive components with associated circuitry that could be applied to oscillators and allow for state of the art phase noise performance at microwave/mm-wave frequencies in a low SWaP package.

SUMMARY OF THE DISCLOSURE

An oscillator having monolithically integrated low loss passive components and associated circuitry, constructed in accordance with the teachings disclosed herein, provides state of the art phase noise performance in a low SWaP form factor. Embodiments exhibit 100× better phase noise than existing low SWaP Commercial Off-The-Shelf (COTS) units.

Regarding noise, noise is frequency dependent and inversely correlated with frequency in accordance with the following: 20 $\log_{10}$ (Frequency). In the context of this disclosure, at a frequency between 30-40 GHz, noise of less than 120 dBc/hz at a 10 KHz offset should be considered ultra-low.

Similarly, to meet low SWaP criteria, power should be kept to less than 20 watts while the size and weight of the component should not substantially affect the total size of the assembly, although the precise power, size, and weight may vary, dependent on the current state of the art in a given field.

One embodiment of the present disclosure provides an oscillator, the oscillator comprising: a dielectric wave guiding resonant cavity; and an oscillator circuit operatively coupled to said dielectric wave guiding resonant cavity comprising at least one transistor, wherein the oscillator circuit is monolithically integrated with the dielectric wave guiding resonant cavity.

Another embodiment of the present disclosure provides such an oscillator wherein the dielectric wave guiding resonant cavity is made of a low dielectric loss material.

A further embodiment of the present disclosure provides such an oscillator wherein the dielectric wave guiding resonant cavity is made of Silicon Carbide.

Yet another embodiment of the present disclosure provides such an oscillator wherein the dielectric wave guiding resonant cavity is made of 4H SiC.

A yet further embodiment of the present disclosure provides such an oscillator wherein the dielectric wave guiding resonant cavity is made of 6H SiC.

Still another embodiment of the present disclosure provides such an oscillator wherein the at least one transistor is a Gallium Nitride high electron mobility transistor.

A still further embodiment of the present disclosure provides such an oscillator wherein the oscillator is configured to oscillate in the range of between 30 GHz to 40 GHz.

Even another embodiment of the present disclosure provides such an oscillator further comprising a thermoelectric cooling module configured to cool the resonator cavity.

An even further embodiment of the present disclosure provides such an oscillator wherein the dielectric wave guiding resonant cavity comprises a photonic bandgap beam resonator.

A still even another embodiment of the present disclosure provides such an oscillator wherein the dielectric wave guiding resonant cavity comprises a micro-ring/disk resonator.

A still even further embodiment of the present disclosure provides such an oscillator wherein the micro-ring/disk resonator is configured to operate in a quasi-TE mode.

Still yet another embodiment of the present disclosure provides such an oscillator wherein the micro-ring/disk resonator is configured to operate in a quasi-TM mode.

A still yet further embodiment of the present disclosure provides such an oscillator wherein the micro-ring/disk resonator is approximately 1.5 mm thick, has a radius of 7.5 mm, and is 3 mm wide.

One embodiment of the present disclosure provides a method of integrating low loss passive components with high electron mobility transistors, the method comprising: obtaining a first material, wherein the first material is a low dielectric loss material that is suitable for etching; growing a second material on a top surface of the first material, wherein the second material is suitable for etching, the first and second materials forming a monolithically integrated assembly having an upper portion made of the first material and a lower portion of the second material; fabricating at least one transistor on said first material; mounting a handle to the first material using an intermediate layer; applying hardmask and photoresist layers to the second material from a backside thereof; stripping the photoresist; performing a deep etch of the second material; stripping the hardmask; and removing the wafer handle and intermediate layers.

Another embodiment of the present disclosure provides such a method wherein the first material is Gallium Nitride.

A further embodiment of the present disclosure provides such a method wherein the second material is Silicon Carbide.

Yet another embodiment of the present disclosure provides such a method wherein the Gallium Nitride is epitaxially grown on the Silicon carbide.

A yet further embodiment of the present disclosure provides such a method wherein the deep etch comprises a reactive ion etch process.

Still another embodiment of the present disclosure provides such a method further comprising performing a backside shallow etch on the second material to form a mounting pedestal using a Nickel hardmask formed by a lift-off process between the steps of mounting a handle to the first material using an intermediate layer and applying hardmask and photoresist layers to the second material from a backside thereof.

One embodiment of the present disclosure provides a method of integrating low loss passive components with high electron mobility transistors, the method comprising: obtaining a first material, wherein the first material is a low dielectric loss material that is suitable for etching; growing a second material on a top surface of the first material, wherein the second material is suitable for etching, the first and second materials forming a monolithically integrated assembly having an upper portion made of the first material and a lower portion of the second material; forming at least one high electron mobility transistor in the second material; and forming at least one passive component in the first material.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

Figure 1:
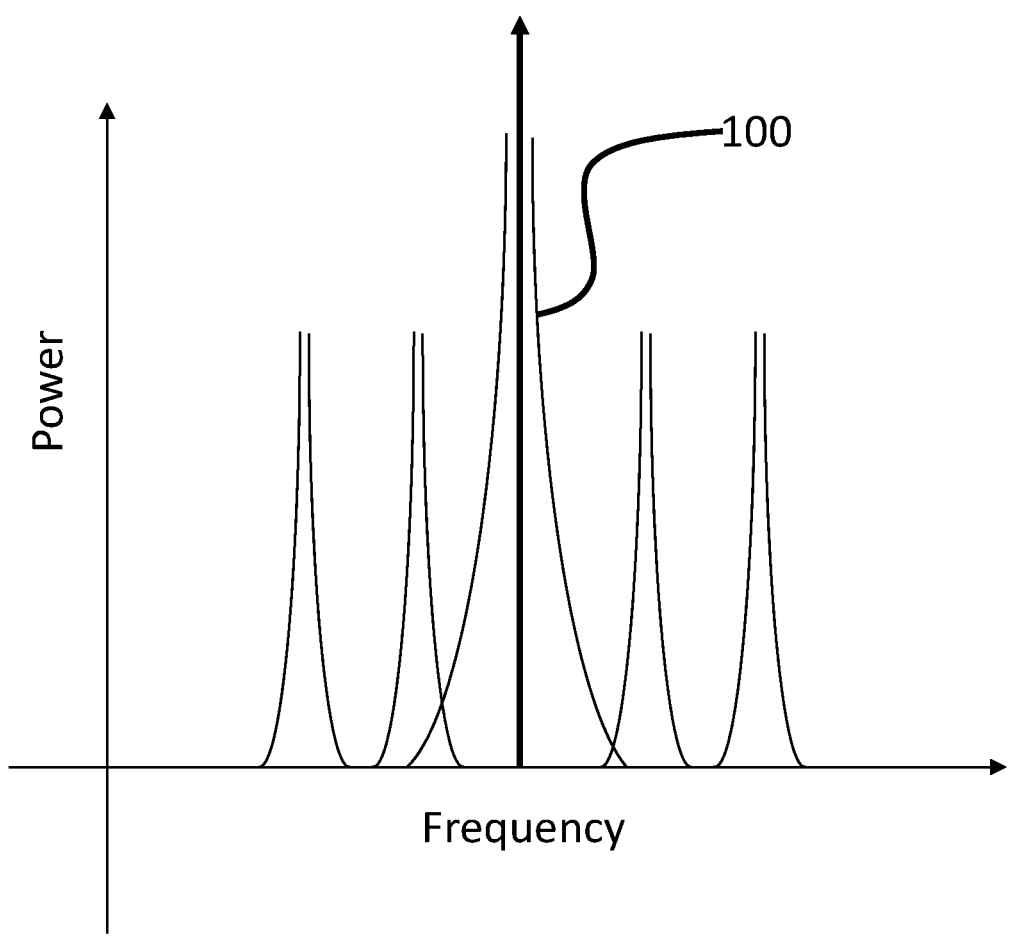
FIG. 1 is a graph showing side bands resulting from modulation of a carrier frequency.
Figure 2A:
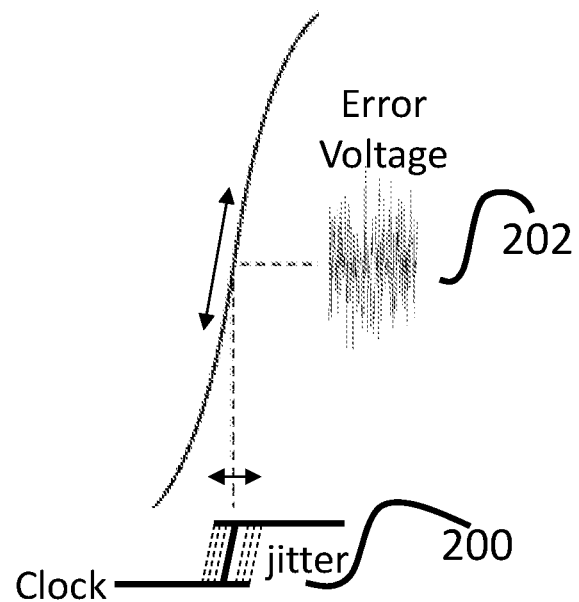
FIG. 2A is a plot of voltage over time showing error resulting from time jitter (phase noise)
Figure 2B:
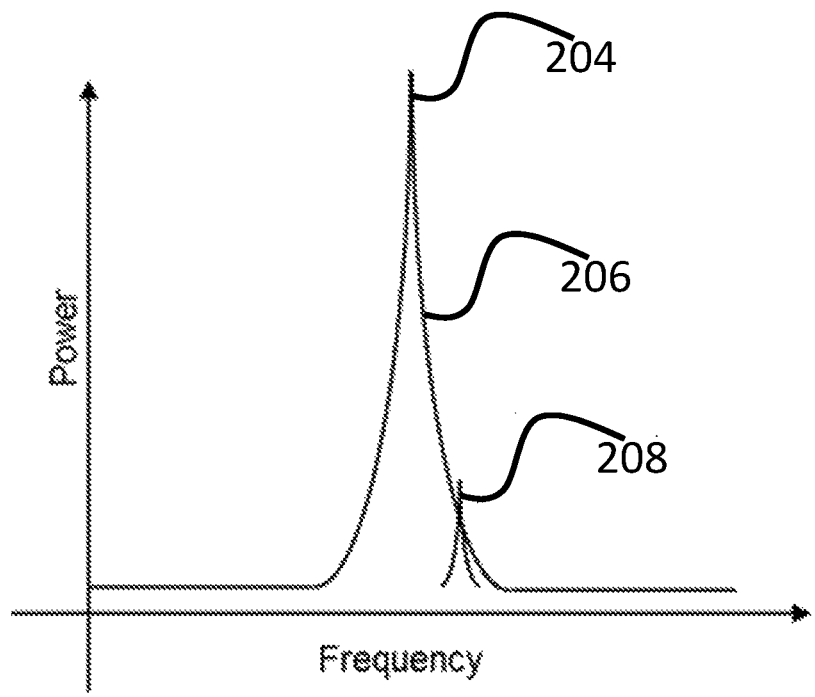
FIG. 2B is a plot of power v. frequency, showing the separation between a transmitted and reflected radar signal.

As discussed herein, the performance of modern microwave equipment reliant on oscillators is often limited by the phase noise 206 of those oscillators, i.e. the frequency domain representation of random fluctuations in the phase of a waveform, which manifests in the time-domain as jitter. For instance, in communications equipment, information is modulated on a carrier frequency, which results in sidebands 100, as illustrated in FIG. 1. Since the carrier frequency spectral width is finite, this limits channel capacity. By reducing phase noise 206, spectral content can be narrowed, resulting in higher channel capacity. Similarly, phase noise 206 in analog to digital conversion equipment results in uncertainties in both sampling time 200 and the sampled signal value 202, as illustrated in FIG. 2A. Referring to FIG. 2B, radar phase noise 206, at the limits of the radar's capabilities, results in a reflected radar signal 208 being difficult to distinguish from a transmitted radar signal 204, especially for low radar cross-section and slow-moving targets.

Oscillator phase noise 206 is predominately determined by the oscillator tank (i.e. the resonator). State of the art benchtop oscillators tend to comprise bulky, and power hungry components, while state of the art low SWaP oscillators tend to use ovenized quartz crystal.

Regarding differences between benchtop sapphire resonator oscillators and low SWaP ovenized quartz crystal devices, sapphire resonators have the advantage of having no metallic parts in the vicinity of the confined electromagnetic energy. As a result, the resonator quality factor is only limited by sapphire dielectric loss (loss tangent), which is in the range of or less than $10^{-6}$, depending on the operating temperature. This enables an ultra-high resonator Q of ~200 k. The output frequency of such an oscillator is approximately 10 GHz, when scaled to 30 GHz the phase noise 206 from such a device is approximately −147 dBc/Hz (@10 kHz offset). The inherent disadvantage, however, is that such an oscillator can be relatively large in size (e.g. 9"×9"×3") and may require cryogenic cooling. Furthermore, fabrication of the sapphire resonator generally involves hand/machine polishing of the resonator structure, which is costly and time-consuming.

Regarding "Q", as used above, throughout the present disclosure "Q" is used to refer to the "quality factor" or "Q factor" of the oscillator. Q is a dimensionless parameter that describes how underdamped an oscillator or resonator is and characterizes a resonator's bandwidth relative to its center frequency. A higher Q indicates a lower rate of energy loss relative to the stored energy of the resonator; i.e. the oscillations die out more slowly. Resonators with high Q have low damping, resulting in longer ringing/vibrating times. Since obtainable Q values are frequency dependent, with obtainable Q values being inversely correlated with frequency, in the context of this disclosure a Q above 10,000 at between 30-40 GHz, the frequency range relevant to embodiments of the present disclosure, should be considered very high, while a Q above 100,000 in this frequency range should be considered ultra-high.

On the other hand, low SWaP, ovenized quartz crystal oscillators (OCXO) utilize quartz piezoelectric resonators that normally operate in the MHz range, therefore the output frequencies must be up-converted into the GHz range for many applications. Although such oscillators have good phase noise 206 when measured at their output frequency (MHz range), the scaled 30 GHz equivalent phase noise 206 from such solutions is only approximately −120 dBc/Hz (@10 kHz offset), due to the frequency conversion process. This phase noise 206 is more than 100× worse than state of art phase noise from bench-top type instruments scaled to the same frequency.

Disclosed herein is a low power, miniaturized, ultra-high Q resonator 602, which comprises a dielectric waveguide structure that is suitable for monolithic integration with high performance binary group 111/V direct bandgap semiconductors, such as Gallium Nitride (GaN) high electron mobility transistors 500, and methods of micro-fabricating the same. The term dielectric waveguide, as used herein, should be understood to refer to a completely non-metallic physical structure that guides electromagnetic waves, in this case waves in the RF portion of the EM spectrum. Furthermore, the disclosed techniques and combinations of materials relating to the production of monolithically integrated low loss passive components with associated circuitry are relevant to all such combinations, not simply to oscillators.

In embodiments, the resonator is a Silicon Carbide (SiC) micro-ring/disk resonator 602, although other topologies, including photonic bandgap beam resonators and other dielectric materials are also suitable. Although embodiments of the disclosed dielectric resonator 602 are suitable for integration with a variety of transistor packages, by amalgamating embodiments of the disclosed resonator 602 with GaN HEMTs 500, an ultra-low-phase noise oscillator in a low SWaP package is achieved. Phase noise 206 of such embodiments rivals that of state of the art bench-top instruments. In addition, the fabrication of such embodiments is compatible with modern micro-fabrication techniques, allowing for batch fabrication of large number of components at the same time, thus reducing costs.

Monolithic integration can only be achieved when the base layers supporting the circuit can be grown or deposited on the substrate (into which the dielectric waveguide/resonant cavity is etched into). This is determined by lattice structure. The lattice constants, which describe how the individual atoms are spaced, must match for the two to be compatible. Furthermore, the lattice structures must also be arranged in compatible ways. Such issues of compatibility would be known to one of ordinary skill in the art.

Figure 3:
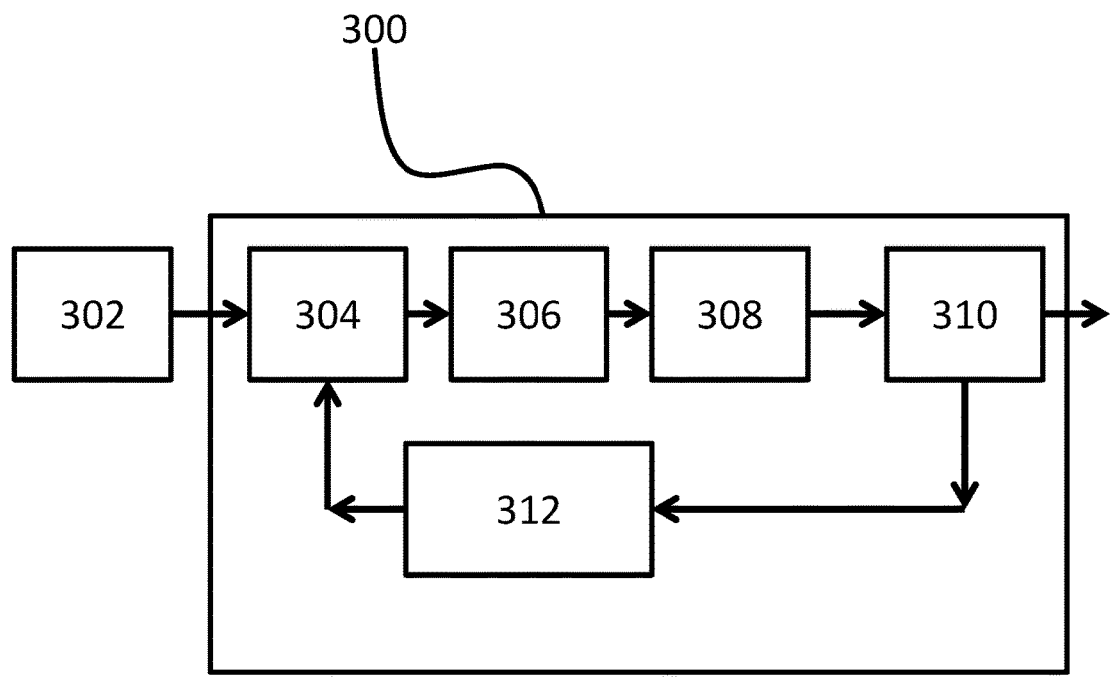
FIG. 3 is a schematic describing the component parts of a prior art low SWaP oscillator.

Now referring to FIG. 3, a current state of the art low SWaP oscillator, which is relatively compact (e.g. 2"×2"×1"), is shown. The low SWaP oscillator comprises an ovenized quartz crystal oscillator 302 having an output frequency of MHz range, and a phase locked loop (PLL) 300 to up-convert the frequency to the system frequency. The PLL 300 consists of a phase detector 304 that is electrically connected to the oscillator 302, which is further electrically connected to a filter 306 that is itself electrically connected to a voltage-controlled oscillator 308 that is finally electrically connected to an output 310, which is further electrically connected to a frequency divider 312 that is itself electrically connected back to the phase detector 304, creating a loop. One such low SWaP oscillator that is currently available is the Wenzel® OCXO, which has the following characteristics:

| Wenzel® OCXO (prior art) | |
|---|---|
| Oscillator Type | OCXO* + PLL** with VCO |
| Resonator Q | ~25 × 10⁴ |
| Resonator f₀ | 0.1 GHz |
| Size | ~2" × 2" × 1" |
| Phase Noise @ 10 kHz Offset (At Resonator f₀) | ~−183 dBc/Hz |
| Scaled Phase Noise @ 10 kHz Offset (At K Band, 30 GHz) | ~−120 dBc/Hz |

*OCXO is an abbreviation for oven-controlled (OC) crystal oscillator (XO)
**PLL is an abbreviation for Phase Locked Loop Compared to current state of the art bench-top solutions, such as the Raytheon® SLR, a sapphire dielectric resonator oscillator that is roughly the size of a shoe box, current low SWaP solutions fall far short. For comparison, the characteristics of the Raytheon® SLR are described below:

| Raytheon® SLR (prior art) | |
|---|---|
| Oscillator Type | Cryogenically Cooled Dielectric Resonator Oscillator |
| Resonator Q | ~20 × 10⁴ |
| Resonator f₀ | 10 GHz |
| Size | ~9" × 9" × 3" |
| Phase Noise @ 10 kHz Offset (At Resonator f₀) | ~−157 dBc/Hz |
| Scaled Phase Noise @ 10 kHz Offset (At K Band, 30 GHz) | ~−147 dBc/Hz |

Both current state of the art solutions fall far short of embodiments configured in accordance with the teachings of the present disclosure, which compare favorably in terms of phase noise 206 characteristics to the current state of the art benchtop solution, the Raytheon® SLR, but in a 15 mm×15 mm package, which is about the size of a quarter. A table comparing the current state of the art to one embodiment of the present disclosure follows:

| | Raytheon® SLR | Wenzel® OCXO | SiC on GaN DRO |
|---|---|---|---|
| Oscillator Type | Cryogenically Cooled Dielectric Resonator Oscillator | Ovenized XO* | TEC* Cooled SiC Dielectric Resonator Oscillator |
| Resonator Q (Estimated) | ~20 × 10⁴ | ~25 × 10⁴ | ~15 × 10⁴ |
| Resonator f₀ (Estimated) | 10 GHz | 0.1 GHz | 35 GHz |
| Size | ~Shoe Box | ~Cigarette Pack | 10 mm × 10 mm |
| Scaled Phase Noise @ 10 kHz (At K band, 30 GHz) | ~−147 dBc/Hz | ~−120 dBc/Hz | ~−143 dBc/Hz |

*TEC is an abbreviation for Thermo-Electric Cooling

Figure 4A:
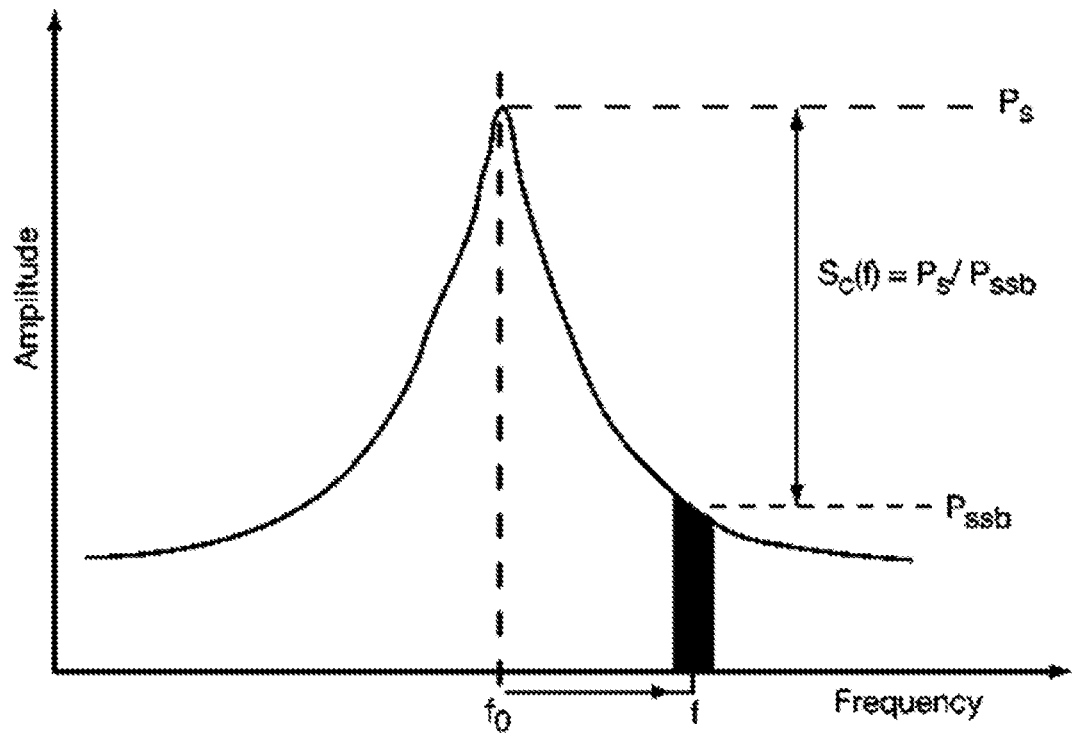
FIG. 4A is a graph of power spectrum showing phase noise at a specific frequency offset.

Now referring to FIG. 4A, FIG. 4A graphically depicts power spectrum and shows phase noise 206 at a specific frequency offset. Phase noise 206 is measured in −X dBc/Hz; at offset f, noise power per Hertz is X dB below the carrier frequency.

Oscillator phase noise 206 can be modeled using the semi-empirical Leeson equation, reproduced below:

$$L(f_m) = 10 \log_{10}\left[\frac{1}{2}\left(\left(\frac{f_0}{2Q_1 f_m}\right)^2 + 1\right)\left(\frac{f_c}{f_m} + 1\right)\left(\frac{FkT}{P_S}\right)\right]$$

where $f_0$ is the output frequency, $Q_1$ is the loaded Q, $f_m$ is the offset from the output frequency (Hz), $f_c$ is the 1/f corner frequency, F is the noise factor of the amplifier, k is Boltzmann's constant in Joules/Kelvin, T is absolute temperature in Kelvins, and $P_s$ is the output power.

As shown in the equation, oscillator phase noise 206 is predominately determined by the quality factor (Q) of the oscillator tank, be it an LC tank, quartz crystal resonator, dielectric material loaded cavity resonator, transmission line resonator, etc.

When $f_0$ is multiplied by the final intended system frequency, phase noise 206, at that frequency, degrades in accordance with the following formula:

Phase Noise Degradation=20 $\log_{10}(f_{system}/f_0)$+N where N=noise from a multiplication circuit and $f_{system}$ is the frequency the system is operated at.

Figure 4B:
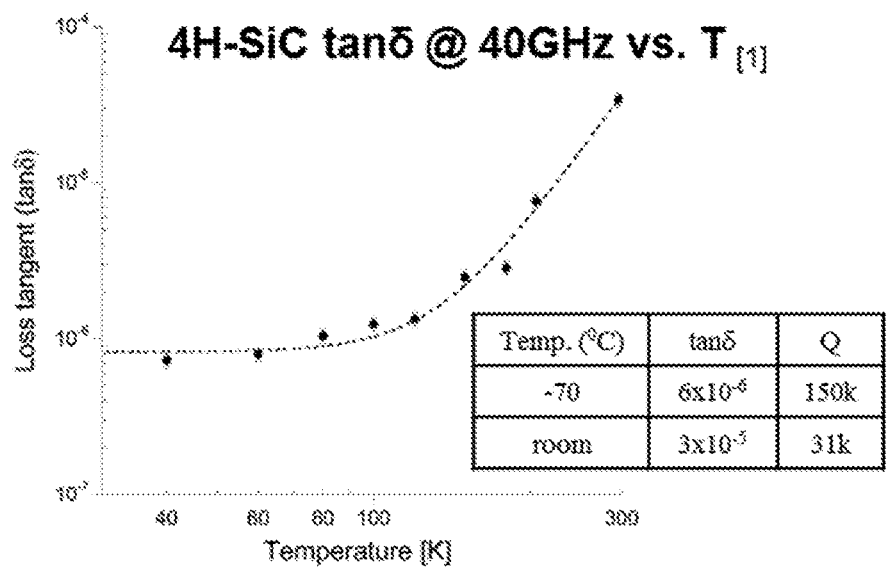
FIG. 4B is a graph showing the measured loss tangent of SiC vs temperature at 40 GHz.

The equation shown in FIG. 4B, which describes Single Side Band (SSB) 206 oscillator phase noise at a given frequency offset from a carrier or center frequency, is reproduced and discussed below:

$S_c(f)=P_s/P_{ssb}$ where $P_s$ is the carrier power, $P_{ssb}$ is the sideband power in one Hz bandwidth at an offset frequency f from the center, and $S_c(f)$ (Single Side Band (SSB) Oscillator phase noise 206) has the units of dBc/Hz.

Achieving low phase noise 206 requires a high resonator 602 Q at the intended system frequency, with minimal frequency conversion. Efforts to achieve this, however, are complicated by the fact that, at microwave frequency, resonator Q is limited by metal loss, with traditional microwave metallic cavity resonators exhibiting quality factors of <30 k at 40 GHz, due to the resistive loss at the metallic interfaces. Additionally, the typical size of a metallic cavity at microwave frequencies is ~50 mm×50 mm×20 mm, making it unsuitable for low-SWaP/low-noise oscillator applications. All-dielectric resonators made from low loss dielectric materials, however, completely avoid metal loss and can be made considerably smaller (as the size is inversely scaled by the square root of the dielectric constant), enabling a high Q in a low SWaP package, as illustrated by the following:

4H—SiC tan δ@40 GHz~6×10−6[1]=>Q~150,000 at 40 GHz where 4H—SiC is a specific polymorph of SiC, tan δ is the loss tangent (the imaginary part of the dielectric loss over the real part of the dielectric loss), and the phase angle of the complex permittivity is the delta.

By using pure dielectric wave-guiding structures in SiC, therefore, the resonator 602 Q is predominately determined by the dielectric loss of SiC (measured by loss tangent), which is in the range of $10^{-6}$ (under thermoelectric cooling), and the radiation/scattering loss at the dielectric interfaces. Such a resonator 602 has no metallic interfaces; the EM energy is confined purely through dielectric guiding.

With proper design and fabrication processes, the radiation/scattering loss can be minimized so that the Q is only limited by the material loss. In embodiments, this translates to a resonator 602 Q of above 150 k, with thermoelectric cooling. In addition, advanced resonator 602 designs may be implemented using microfabrication techniques to miniaturize resonator 602 size and cost.

Two distinct resonator 602 topologies that are suitable for monolithic integration at microwave frequencies are photonic bandgap based resonators and micro-ring/disk resonators 602. With either topology, one can potentially achieve material loss limited quality factor. However, the fabrication of photonic bandgap beam resonators involves challenging deep reactive ion etching of high aspect ratio structures into SiC without providing significant benefits over micro-ring/disk resonators 602.

Figure 10A:
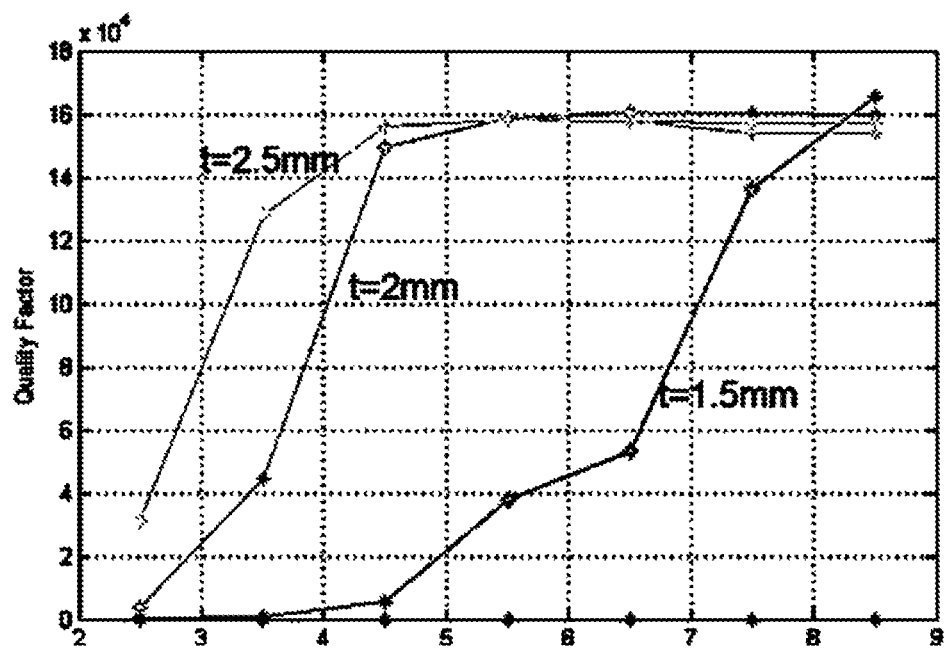
FIG. 10A is a chart showing quality factor v. radius of a SiC micro-ring resonator embedded in an air cylinder operating in a Quasi-TE mode, in accordance with embodiments of the present disclosure.
Figure 10B:
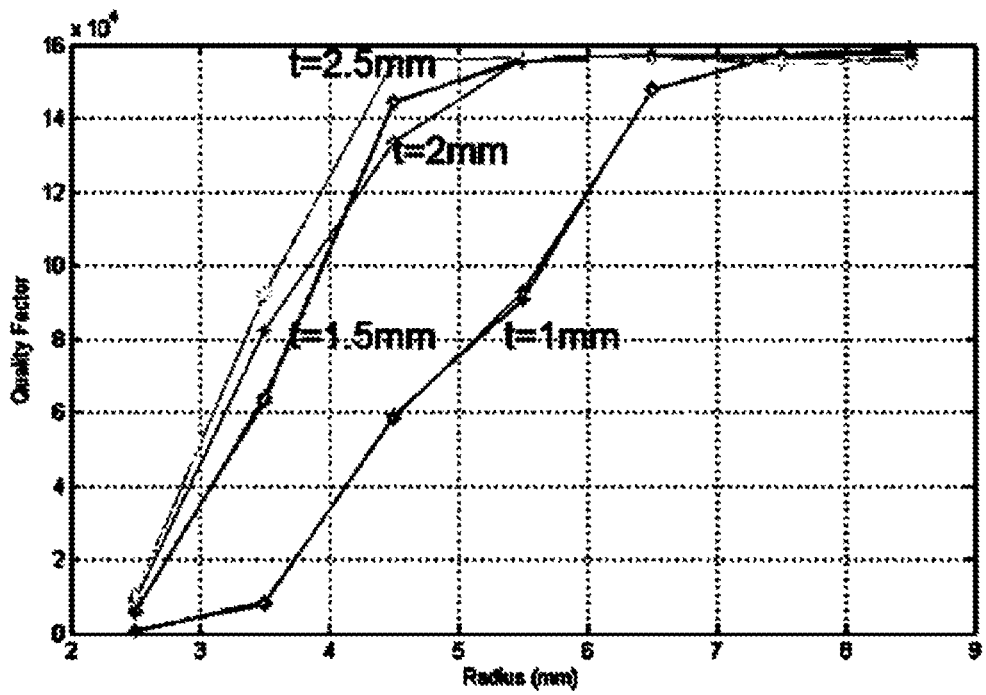
FIG. 10B is a chart showing quality factor v. radius of a SiC micro-ring resonator embedded in an air cylinder operating in a Quasi-TM mode, in accordance with embodiments of the present disclosure.
Figure 11:
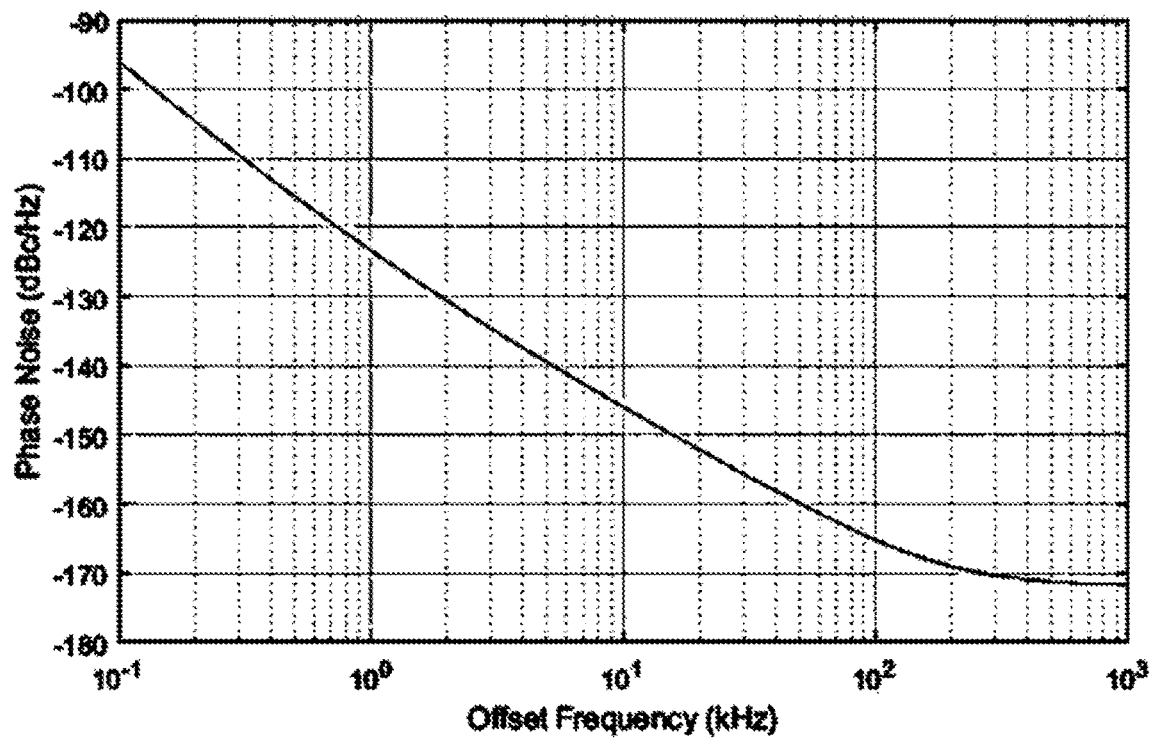
FIG. 11 is a chart showing phase noise of a performance of SiC micro-ring resonator oscillator scaled at 30 GHz, in accordance with embodiments of the present disclosure.

Regarding SiC micro-ring/disk resonators 602, simulation was performed with a SiC micro-ring resonator 602 embedded in an air cylinder. On the surfaces of the air cylinder, perfect matched layers were attached, to absorb radiated EM power from the resonator 602. Because of the dielectric guiding, the electromagnetic energy travels along the rim of the SiC ring, forming a travelling wave cavity mode. Depending on the polarization of the wave, two dominant mode families can be supported by the SiC micro-ring structure, quasi-TE and quasi-TM. As the lowest order modes exhibit the smallest radiation loss for the same resonator 602 footprint, the analyses are focused on fundamental quasi-TE and quasi-TM modes. FIGS. 10A and 10B show the electric field intensity and transverse components of the electric and magnetic fields of the quasi-TE and quasi-TM modes; the resonant frequencies are 39 GHz and 39.5 GHz, respectively. The radius and thickness of the ring were swept to study their impact on quality factors. For both modes, the quality factor increases with the thickness of the ring for the same radius. As RIE etching of SiC over 1.5 mm thickness requires intensive process development, embodiments utilize a final ring thickness of 1.5 mm. At such thickness, quasi-TM mode out-performs quasi-TE mode with respect to Q, for the same radius. Therefore, in embodiments, the resonator 602 is designed to operate in fundamental quasi-TM mode. Furthermore, in embodiments, the resonator 602 has a radius of 7.5 mm, which is a compromise between resonator 602 size and quality factor. Other embodiments utilize radii of between 6-9 mm. Still further embodiments utilize a ring width of 3 mm to suppress spurious modes without compromising the quality factor. The quality factor of such embodiments is approximately 155 k at 39.5 GHz. Other embodiments utilize a ring width of between 2-4 mm. The simulated phase noise 206 of such a SiC resonator 602, scaled to a 30 GHz output frequency, is shown in FIG. 11.

In minimizing the total noise inherent in a system comprising an oscillator 600, the noise from transistors 500 operating in conjunction with the oscillator 600 should be included when determining the noise performance of the oscillator 600. Oscillator 600 close-to-carrier phase noise 206 is dominated by the flicker noise of the circuit 604. This is because oscillator circuitry 604 is time-variant, therefore causing up-conversion of transistor flicker noise to the oscillator 600 output frequency. Normally, bipolar transistors exhibit lower flicker noise than field-effect transistors made from the same material system, as the FET channel, in use, is exposed to various surface states, causing random trapping of the carrier. However, GaN HEMTs 500, despite being FETs, operate with a much larger voltage swing as compared to other technologies, which counteracts the flicker noise caused by the surface states. Indeed, because oscillator phase noise 206 is always measured after being normalized to the output power, the noise performance of GaN HEMTs 500 is on-par with Indium phosphide (InP) Heterojunction Bipolar Transistors (HBT), which are the benchmark for close-to-carrier noise performance.

Therefore, by combining high performance transistors 500 and low loss dielectric materials on the same, monolithically integrated platform, phase noise 206 rivaling that of current state of the art benchtop solutions is obtained in a low SWaP package. In embodiments, this is accomplished using a GaN-on-SiC High Electron Mobility Transistor (HEMT) 500 platform, where SiC is used as a substrate for a GaN HEMT 500, allowing the SiC resonator 602 to be intimately integrated with GaN HEMT 500 and forming a single-chip, ultra-low-phase-noise oscillator 600. Said another way, by amalgamating an ultra-high-Q SiC resonator 602 with high performance GaN HEMT 500 on a single chip platform, state of art oscillator phase noise 206 performance at chip-scale is enabled.

Figure 5:
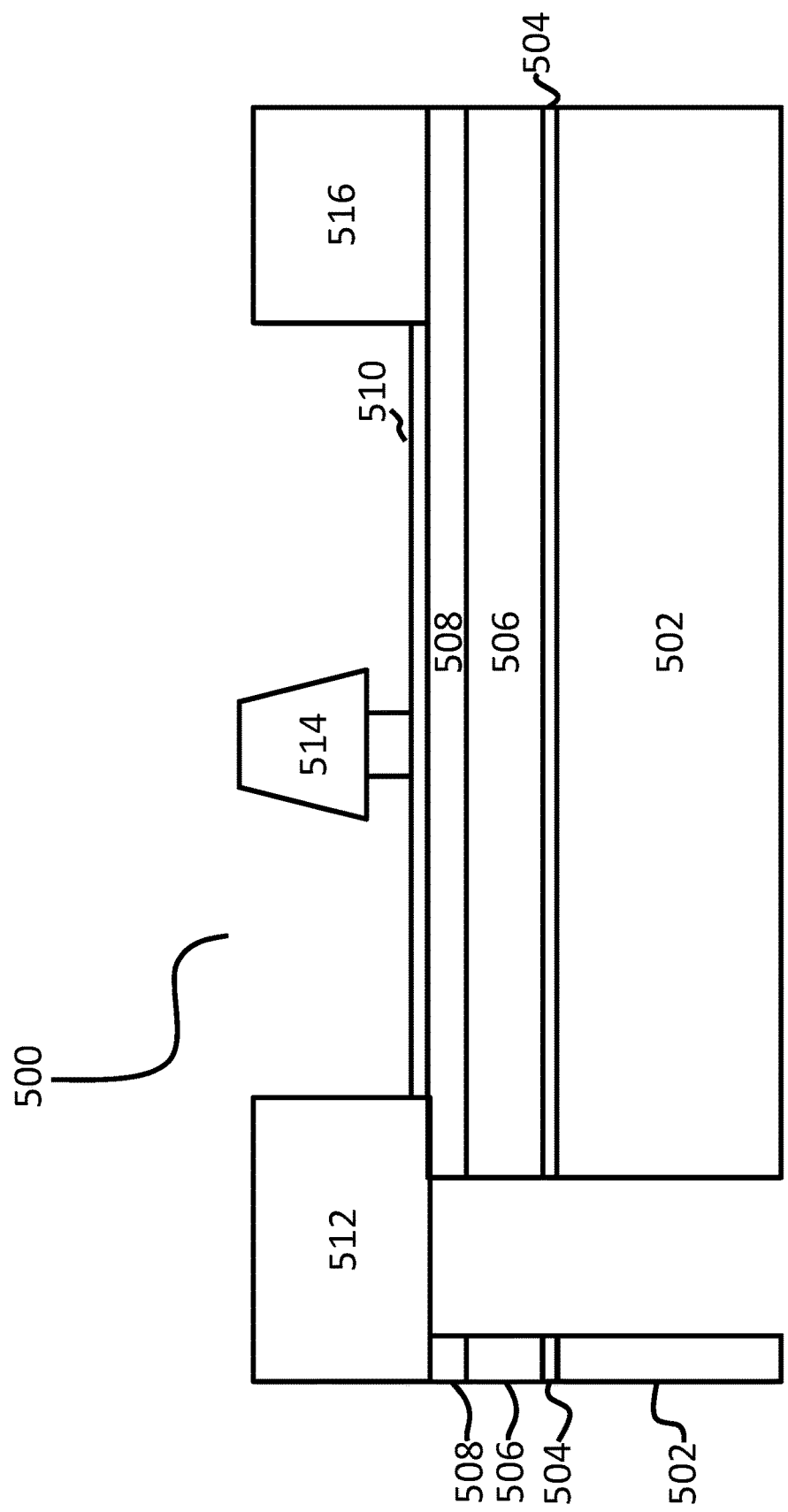
FIG. 5 is a schematic showing a GaN-on-SiC High Electron Mobility Transistor (HEMT) configured in accordance with embodiments of the present disclosure.

Now referring to FIG. 5, such a high performance GaN HEMT 500 fabricated on a SiC substrate 502 is shown. The GaN HEMT 500 depicted in this figure comprises a SiC substrate 502, a nucleation layer 504 deposited on the SiC substrate 502, a GaN buffer 506 deposited on the nucleation layer 504, and an AlGaN (Aluminum Gallium Nitride) layer 508 deposited on the GaN buffer 506 that is capped by GaN 510. On top of the undoped GaN cap 510 is a transistor source 512, a transistor T-gate 514, and a transistor drain 516.

In embodiments, the total stack height is approximately 2 microns while the total thickness of the circuit is approximately 10-20 microns.

Figure 6A:
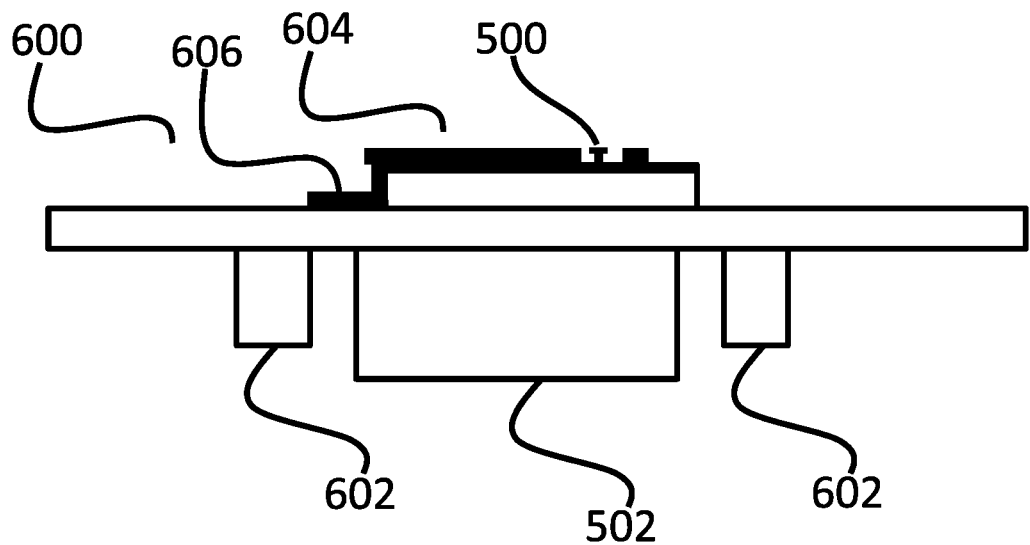
FIG. 6A is a top view of an ultra-high-Q SiC dielectric resonator oscillator configured in accordance with embodiments of the present disclosure.
Figure 6B:
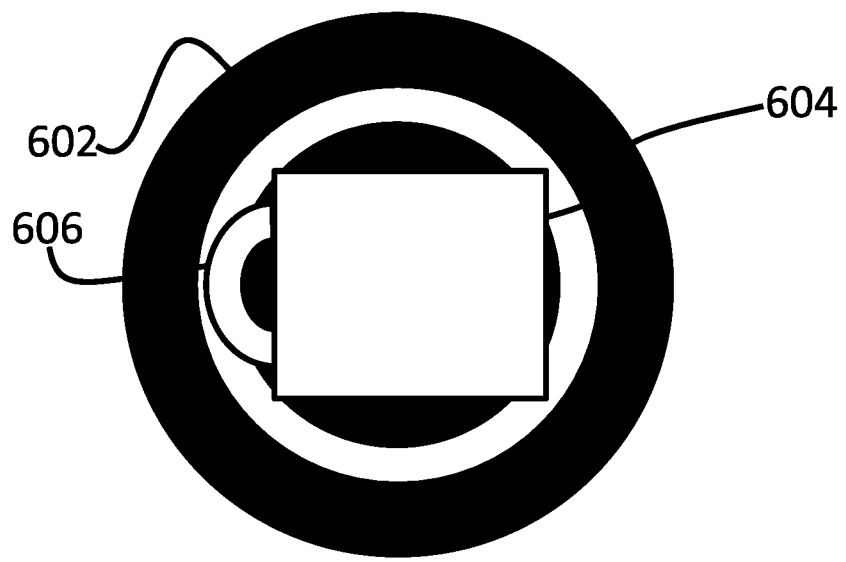
FIG. 6B is a top, section view of the ultra-high-Q SiC dielectric resonator oscillator of FIG. 6A configured in accordance with embodiments of the present disclosure.
Figure 7:
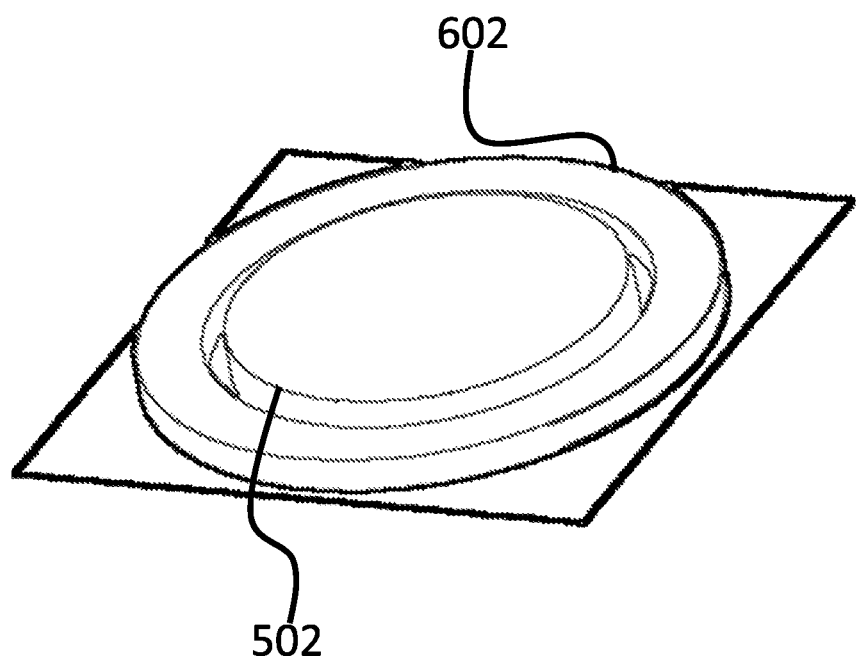
FIG. 7 is a bottom-perspective view of a SiC dielectric resonator configured in accordance with embodiments of the present disclosure.

Now referring to FIG. 6A, a top view of a monolithically integrated high Q SiC resonator 602 oscillator 600 configured in accordance with embodiments of the present disclosure is shown. The oscillator 600 comprises the GaN HEMT circuitry 604 (shown in more detail in FIG. 5) and auxiliary passive components atop a SiC 502 base and further comprises a SiC dielectric resonator 602, which, in embodiments, is formed through a back-side reactive ion etch (RIE) process, GaN oscillator circuitry 604, and a coupling 606 between the GaN oscillator circuitry 604 and the SiC dielectric resonator 602. FIG. 6B is a top, section view of the monolithically integrated high Q SiC resonator 602 oscillator 600 of FIG. 6A while FIG. 7 is a bottom-perspective view of the same.

In embodiments, the oscillator 600 operates in the 30 GHz to 40 GHz range, i.e. IEEE Ka band. In embodiments, the oscillator 600 output signal is frequency-converted to frequencies outside of the IEEE Ka band.

One embodiment of the coupling 606 utilizes a co-planar waveguide (CPW), as the CPW supports a TEM mode of operation that can couple energy into either the quasi-TE or quasi-TM mode of the resonator 602. In addition, the dimensions of the CPW need to be designed to provide mode and phase match between the CPW TEM mode to the targeted resonator 602 mode.

In embodiments, the dielectric resonator 602 is made of 4H-SiC while, in other embodiments, it is made of SiC 6-H. In still other embodiments, other polymorphs of SiC are used.

Figure 8:
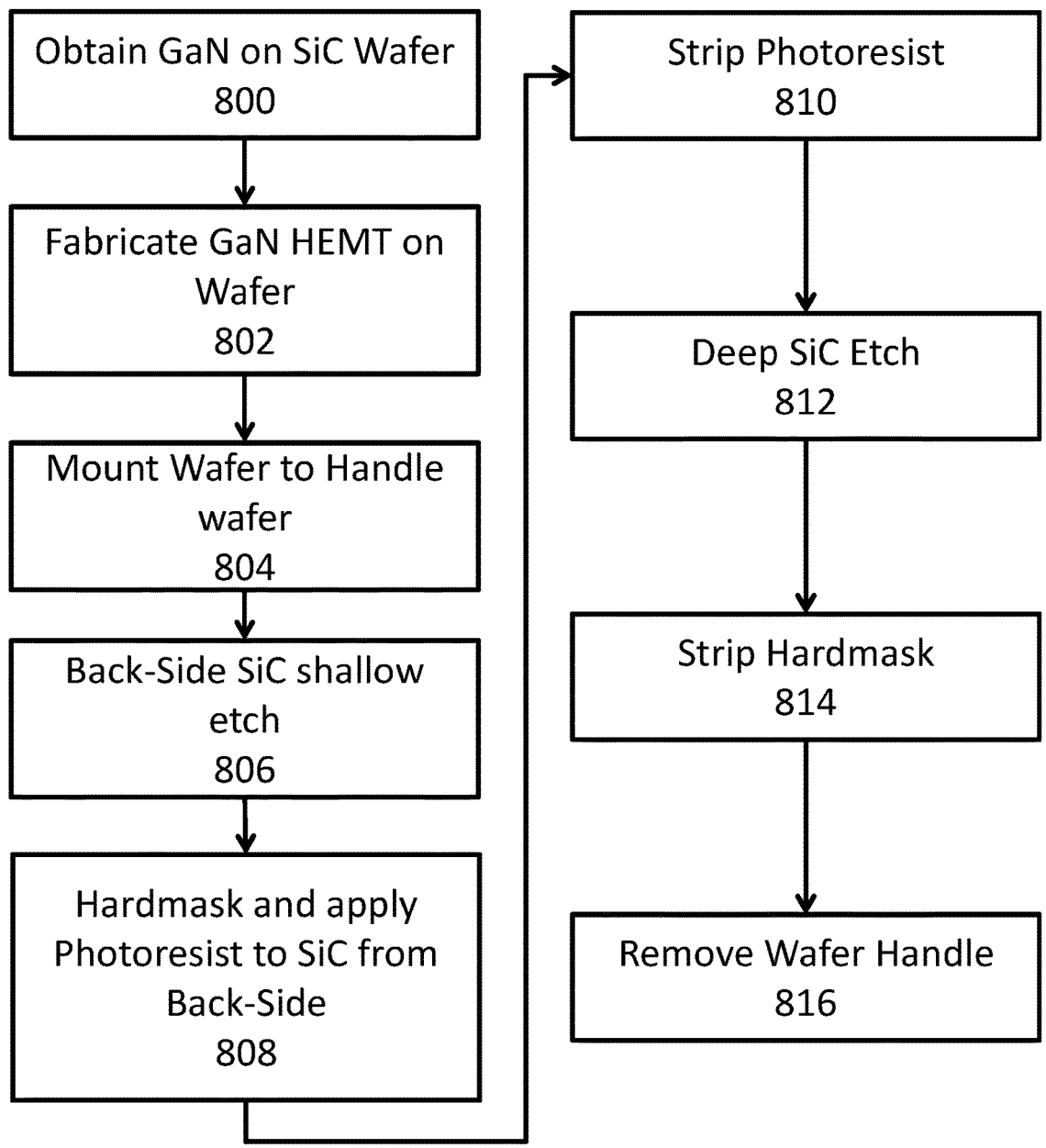
FIG. 8 is a flowchart describing a method of monolithically integrating a low loss passive component into a compatible substrate material, in accordance with embodiments of the present disclosure.
Figure 9A:
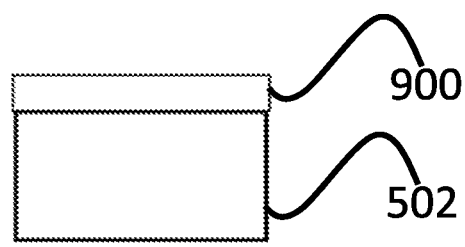
FIG. 9A is a schematic showing a GaN layer grown on a SiC substrate, forming a monolithically integrated assembly, in accordance with embodiments of the present disclosure.
Figure 9B:
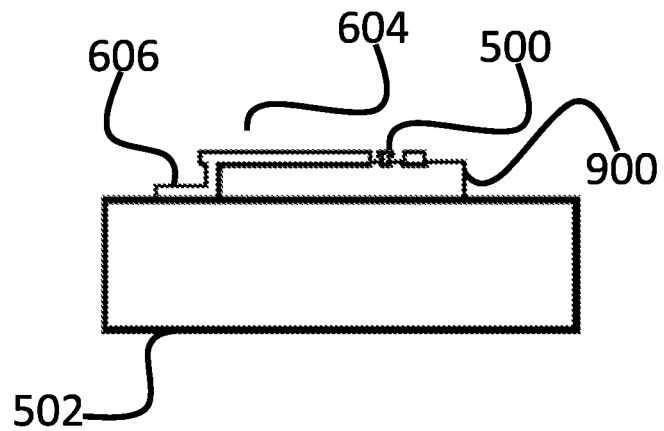
FIG. 9B is a schematic showing a coupling and GaN HEMT circuit added to the monolithically integrated assembly of the previous figure, in accordance with embodiments of the present disclosure.
Figure 9C:
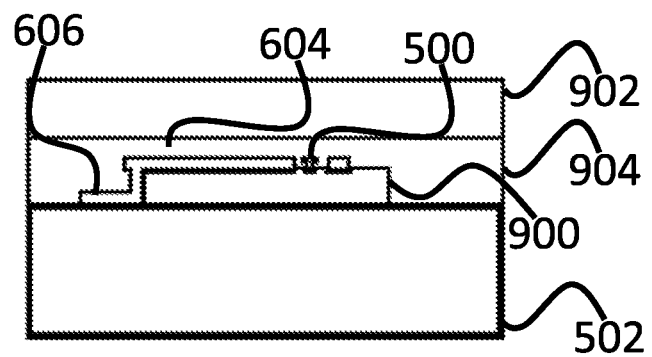
FIG. 9C is a schematic showing wax and a handle wafer attached to the monolithically integrated assembly of the previous figure, in accordance with embodiments of the present disclosure.
Figure 9D:
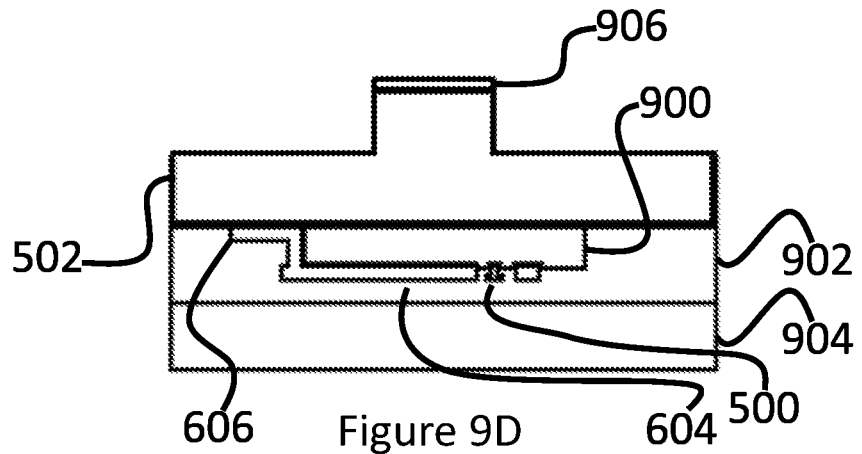
FIG. 9D is a schematic showing a back-side etch performed on the monolithically integrated assembly of the previous figure, in accordance with embodiments of the present disclosure.
Figure 9E:
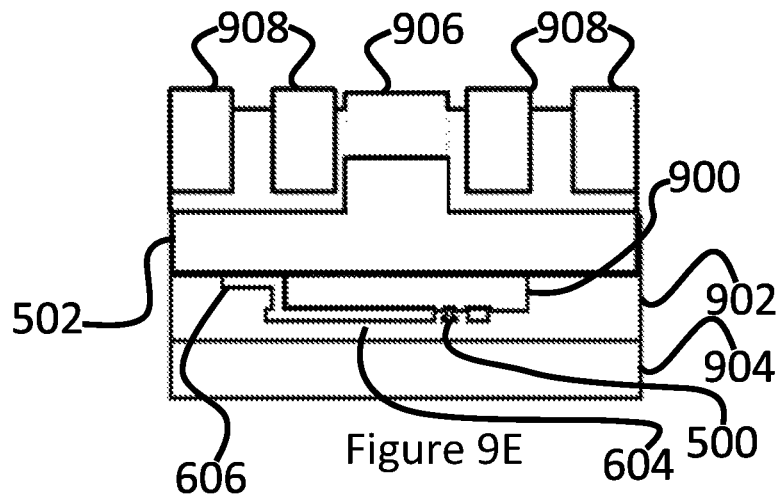
FIG. 9E is a schematic showing a photoresist and hardmask applied to the monolithically integrated assembly of the previous figure, in accordance with embodiments of the present disclosure.
Figure 9F:
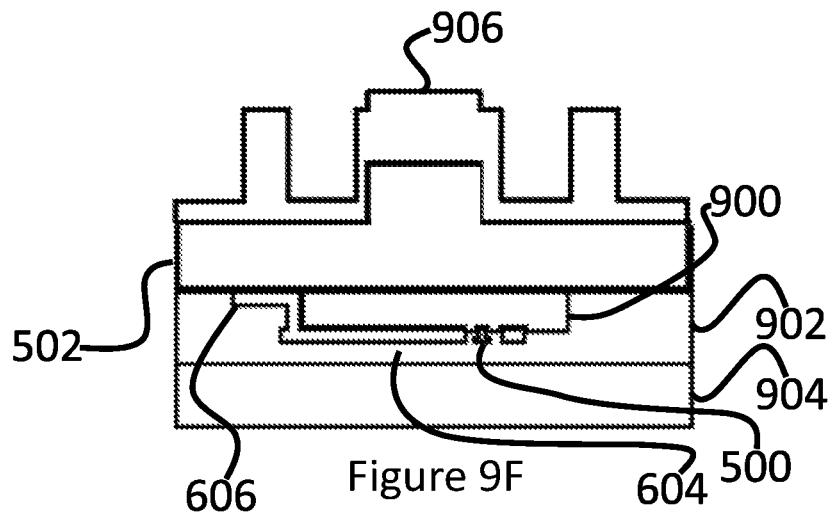
FIG. 9F is a schematic showing the photoresist of FIG. 9E stripped from the monolithically integrated assembly of the previous figure, in accordance with embodiments of the present disclosure.
Figure 9G:
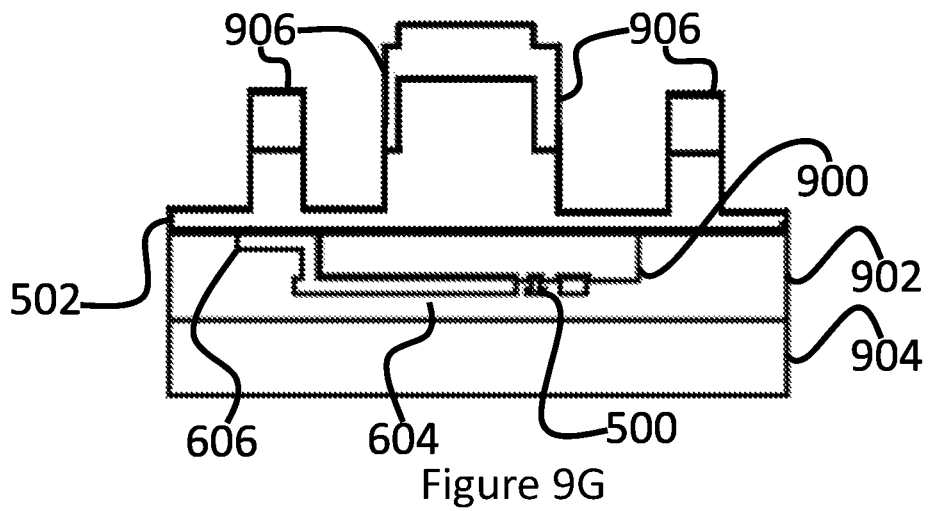
FIG. 9G is a schematic showing a deep etch of the monolithically integrated assembly of the previous figure, in accordance with embodiments of the present disclosure.
Figure 9H:
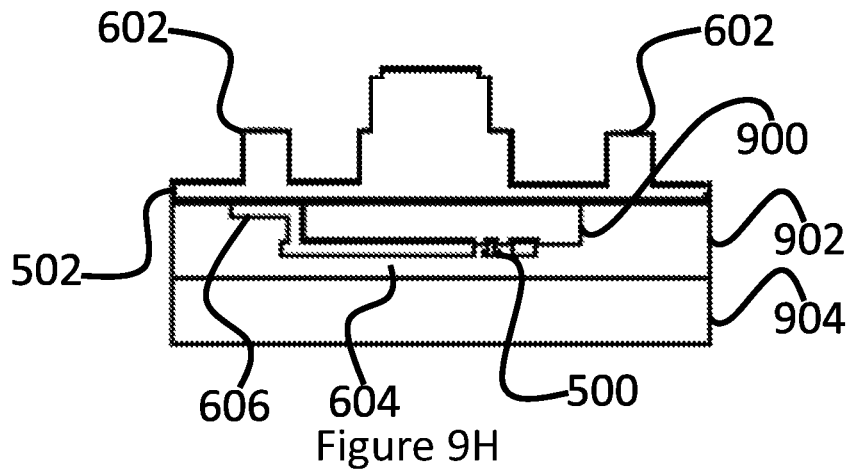
FIG. 9H is a schematic showing the hardmask of FIG. 9G stripped from the monolithically integrated assembly, in accordance with embodiments of the present disclosure.
Figure 9I:
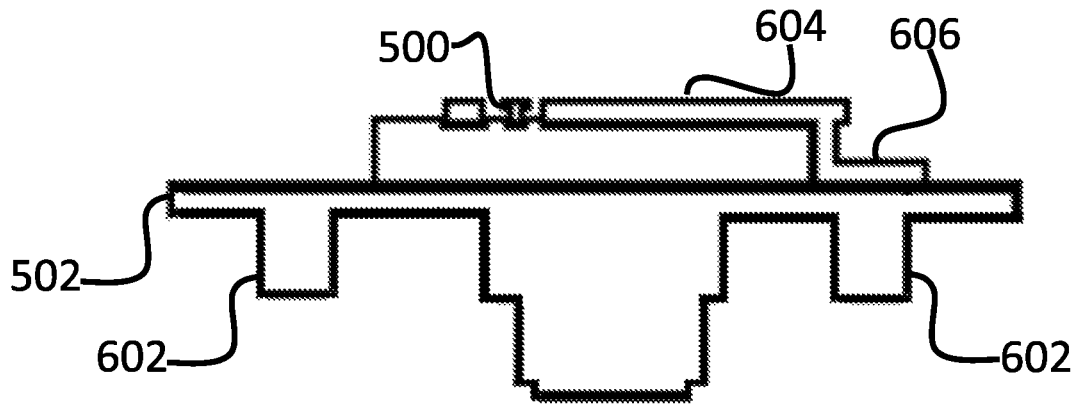
FIG. 9I is a schematic showing the handle wafer and wax of FIG. 9H detached and the substrate rotated 180 degrees, in accordance with embodiments of the present disclosure.

Now referring to FIG. 8, a flowchart detailing the steps necessary to monolithically integrate a low loss passive component into a compatible substrate material, in accordance with embodiments of the present disclosure, is shown. The first step is to obtain compatible materials, e.g. a GaN 900 on SiC wafer 800, such as that shown in FIG. 9A, which could be accomplished in a number of ways that would be known to one of ordinary skill in the art. In embodiments, the GaN 900 on SiC wafer is a 1.5 mm thick 6 in. diameter 4H—SiC wafer with epitaxially grown GaN HEMT 500 device layers. In other embodiments, the GaN wafer 900 is between 1 mm and 2 mm thick. After obtaining a GaN 900 on SiC wafer 800, a GaN HEMT 500 is fabricated on the wafer 802, as shown in FIG. 9B. Following this step, a handle 902, which, in embodiments, is made of solid sapphire, is mounted on the wafer 900 using an intermediate layer of wax 904/804, as shown in FIG. 9C. After attachment of the handle 804, the wafer 900 can be flipped and the SiC back-side etched 806 using a masking layer 906 (e.g. a hard-mask 906), as shown in FIG. 9D. Following back-side etching 806, photoresists 908 are applied and patterned by photolithography to the SiC layer 502 from the back-side 808, as shown in FIG. 9E. Another thick layer of hard-mask is selectively electroplated over areas without photoresist 908. The photoresist 908 is then stripped 810 (see FIG. 9F) 810, in some cases using a wet chemical etching process (e.g. organic solvent, acetone, IPA or dry etch strip using O2 plasma), the SiC layer 502 deep etched (see FIG. 9G) 812, in embodiments using fluorine based RIE, the hardmask 906 stripped 814 (see FIG. 9H) 814, and the wafer handle removed 816 (see FIG. 9I).

One advantage of the above-noted process is that it is compatible with batch microfabrication techniques, where a large number of oscillator 602 chips can be manufactured on a single 6 in. wafer 900.

In embodiments, hard masking and application of a photoresist layer 908 comprises sputtering of a conformal Ni seed layer for the electroplating of a thick Ni hard mask 906. The photoresist 908 may be patterned on top of the Ni seed layer to prevent electroplating build up at locations with photoresist 908.

In embodiments, a SiC Ka band dielectric ring resonator 602 is microfabricated from the backside into the SiC substrate using a deep SiC Reactive Ion Etching (RIE) process while a cylindrical mounting post is simultaneously formed at the center of the SiC ring. Such a post provides mechanical ruggedness and acts as a heat sink for the structure. In addition, the resonating electromagnetic energy of such a structure is predominately confined close to the outer rim of the ring structure, thereby minimizing the unavoidable loss caused by the chip-mounting fixtures. In such embodiments, the RIE may be timed so that the SiC is not etched all the way through, leaving ~100 um left. Additionally, this optional shallow etch may be performed using Ni hard-mask 906 formed by lift-off process.

In embodiments, the final monolithically integrated oscillator chip has a footprint of ~15 mm×15 mm×1.5 mm.

Such a technology could provide significant benefits in at least the following applications:
1. Replace current system clocks, enabling next gen. high performance small form factor systems;
2. Higher Q at higher frequency allows for wider bandwidth settings in subsequent Phase Locked Loops (PLLs), resulting in an approximate 100× improvement in phase noise, and improvements in PLL settling speed* (*the time elapsed from the application of an ideal instantaneous step input to the time at which the output has entered and remained within a specified error band); and
3. Ultra-low noise high frequency clock source for high-rate Analog-to-Digital Converters (ADCs).

Embodiments of the ultra-high Q SiC resonators 602 disclosed herein may also be used as ultra-low loss passive components for microwave circuits (e.g., low loss filters, couplers, impedance matching, dielectric resonator antenna, etc.).

The foregoing description of the embodiments of the disclosure has been presented for the purposes of illustration and description. It is not intended to be exhaustive or to limit the disclosure to the precise form disclosed. Many modifications and variations are possible in light of this disclosure. It is intended that the scope of the disclosure be limited not by this detailed description, but rather by the claims appended hereto.

What is claimed is:

1. An oscillator, comprising:
 a dielectric waveguide resonator, wherein the dielectric waveguide resonator comprises Silicon Carbide; and
 an oscillator circuit operatively coupled to the dielectric waveguide resonator comprising at least one transistor, wherein the oscillator circuit is monolithically integrated with the dielectric waveguide resonator.

2. The oscillator of claim 1 wherein the dielectric waveguide resonator comprises 4H SiC.

3. The oscillator of claim 1, wherein the dielectric waveguide resonator comprises 6H SiC.

4. The oscillator of claim 1, wherein the at least one transistor is a Gallium Nitride high electron mobility transistor.

5. The oscillator of claim 1, wherein the oscillator is configured to oscillate in the range of between 30 GHz to 40 GHz.

6. The oscillator of claim 1, further comprising a thermoelectric cooling module configured to cool the dielectric waveguide resonator.

7. The oscillator of claim 1, wherein the dielectric waveguide resonator comprises a photonic bandgap beam resonator.

8. The oscillator of claim 1, wherein the dielectric waveguide resonator comprises a micro-ring/disk resonator.

9. The oscillator of claim 8, wherein the micro-ring/disk resonator is configured to operate in a quasi-TE mode.

10. The oscillator of claim 8, wherein the micro-ring/disk resonator is configured to operate in a quasi-TM mode.

11. The oscillator of claim 8, wherein the micro-ring/disk resonator is approximately 1.5 mm thick, has a radius of 7.5 mm, and is 3 mm wide.

12. A method of integrating low loss passive components with high electron mobility transistors, the method comprising:

obtaining first material, wherein the first material is a low dielectric loss material that is suitable for etching;

growing a second material on a top surface of the first material, wherein the second material is suitable for etching, the first and second materials forming a monolithically integrated assembly having an upper portion made of the first material and a lower portion of the second material;

fabricating at least one transistor on the first material;

mounting a handle to the first material using an intermediate layer;

applying hardmask and photoresist layers to the second material from a backside thereof;

stripping the photoresist;

performing a deep etch of the second material;

stripping the hardmask; and removing the wafer handle and intermediate layers.

13. The method of claim 12, wherein the first material is Silicon Carbide.

14. The method of claim 13, wherein the second material is Gallium Nitride.

15. The method of claim 14, wherein the Gallium Nitride is epitaxially grown on the Silicon carbide.

16. The method of claim 14, wherein the deep etch comprises a reactive ion etch process.

17. The method of claim 14, further comprising performing a back-side shallow etch on the second material to form a mounting pedestal using a Nickel hardmask formed by a lift-off process between the steps of mounting a handle to the first material using an intermediate layer and applying hardmask and photoresist layers to the second material from a backside thereof.

18. A method of integrating low loss passive components with high electron mobility transistors, the method comprising:

obtaining a first material, wherein the first material is a low dielectric loss material that is suitable for etching;

growing a second material on a top surface of the first material, wherein the second material is suitable for etching, the first and second materials forming a monolithically integrated assembly having an upper portion made of the first material and a lower portion of the second material;

forming at least one high electron mobility transistor in the second material; and etching at least one passive component in the first material.

* * * * *